United States Patent
Hynes et al.

(10) Patent No.: US 7,286,393 B2
(45) Date of Patent: Oct. 23, 2007

(54) SYSTEM AND METHOD FOR HARDENING MRAM BITS

(75) Inventors: Owen J. Hynes, Otsego, MN (US); Romney Katti, Maple Grove, MN (US); Harry H. L. Liu, Plymouth, MN (US); Michael S. Liu, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 162 days.

(21) Appl. No.: 11/096,179

(22) Filed: Mar. 31, 2005

(65) Prior Publication Data

US 2006/0221675 A1    Oct. 5, 2006

(51) Int. Cl.
 *G11C 11/00* (2006.01)
(52) U.S. Cl. .................. 365/158; 365/171; 365/173
(58) Field of Classification Search ............... 365/158, 365/171, 173, 174, 175
See application file for complete search history.

(56) References Cited

U.S. PATENT DOCUMENTS

| 4,731,757 | A | 3/1988 | Daughton | 365/173 |
| 5,631,863 | A | 5/1997 | Fechner | 365/156 |
| 6,058,041 | A | 5/2000 | Golke | 365/156 |
| 6,331,943 | B1 | 12/2001 | Naji et al. | 365/158 |
| 6,445,612 | B1 * | 9/2002 | Naji | 365/158 |
| 6,496,436 | B2 * | 12/2002 | Naji | 365/209 |
| 6,639,852 | B2 * | 10/2003 | Chiu | 365/196 |
| 6,862,228 | B2 * | 3/2005 | Hung et al. | 365/189.09 |
| 2002/0044482 | A1 | 4/2002 | Viehmann | 365/158 |
| 2003/0053331 | A1 | 3/2003 | Naji | 365/158 |
| 2003/0090935 | A1 | 5/2003 | Hidaka | 365/171 |
| 2004/0184315 | A1 | 9/2004 | Hidaka | 365/171 |
| 2006/0145086 | A1 * | 7/2006 | Liu et al. | 250/370.14 |

FOREIGN PATENT DOCUMENTS

| EP | 1 321 941 A1 | 6/2003 |
| EP | 1 321 944 A1 | 6/2003 |

OTHER PUBLICATIONS

Brusius, Phil and Al Hurst, "Reliability and Qualification of Radiation Hardened Memory Technologies", Feb. 3, 2004. www.aero.org/conferences/mrgw/2004/papers/A-II-1.pdf.
Miller, Sandra Kay, "Motorola's New Hot Rod : The First 4Mb MRAM Chip Zooms Ahead" Processor, vol. 25, Issue 51, Dec. 19, 2003.
"Motorola Moves MRAM Memory Technology Closer to Market" Electronic Supply and Manufacturing, May 10, 2000.
Motorola Fact Sheet "MRAM Technology" MRAM-300-6-02, Motorola Inc. 2002.
International Search Report for PCT/US2005/045651 dated Jun. 6, 2006.

* cited by examiner

*Primary Examiner*—Tuan T Nguyen
*Assistant Examiner*—Hien N Nguyen
(74) *Attorney, Agent, or Firm*—McDonnell Boehnen Hulbert & Berghoff LLP

(57) ABSTRACT

A device is connected in parallel with an MTJ structure of an MRAM bit to shunt photocurrent away from and/or limit voltage across the MTJ structure during a dose rate event. The device may include at least one transistor and/or at least one diode. One device may be used to protect an entire row and/or column of MRAM bits. As a result, the MRAM bits are protected during a dose rate event.

13 Claims, 4 Drawing Sheets

SYSTEM AND METHOD FOR HARDENING MRAM BITS

GOVERNMENT RIGHTS

The United States Government has acquired certain rights in this invention pursuant to Contract No. DTRA-01-00-C-0002 awarded by the Defense Threat Reduction Agency.

FIELD

The present invention relates generally to magnetoresistive random access memory (MRAM) devices, and more particularly, relates to radiation hardness of MRAM bits.

BACKGROUND

When a nuclear bomb is detonated, intense fluxes of gamma rays, x-rays, and other high energy particles are created. When integrated circuits are exposed to this type of harsh environment, a large number of electrons and holes are generated in the silicon, causing large photocurrents to be generated. Under certain conditions, these photocurrents can lead to rail-span collapse, and burnout of metal lines, contacts, and vias. This damage to the integrated circuits can ultimately result in system failure.

Some integrated circuits, such as integrated circuits used in strategic weapons systems, are designed to continue operating during and after a nuclear bomb attack or other dose rate event. Many of these integrated circuits include memory. The memory exposed to dose rate events needs to be hardened or the memory may be damaged.

MRAM is one type of memory that may be used in applications that expose circuitry to dose rate events. Typically, each memory cell in MRAM contains a magnetic tunnel junction (MTJ) structure and a selection or control transistor. The MTJ structure consists of a layer of insulating material between two electrodes of magnetic material. Current flows or "tunnels" perpendicularly from one magnetic layer to the other magnetic layer through the insulator. At the base of one electrode is a fixed ferromagnetic layer that creates a strong pinning field to hold the magnetic polarization of the layer in one specific direction. The other ferromagnetic layer is free to rotate and hold polarization in one of the two directions.

The MTJ structure is sensitive to bias voltage placed across it. During a dose rate event, photocurrent flows through the MTJ structure, which can damage the insulating material in the MTJ structure. For example, voltages in excess of 500 mV may cause significant reliability degradation, while voltages in the 1 V range may cause catastrophic damage, usually in the form of a short circuit condition. Therefore, it would be beneficial to harden the MTJ structure to protect MRAM bits during a dose rate event.

SUMMARY

A system and method for hardening MRAM bits is described. A hardened MRAM bit includes a MTJ connected to a first transistor and a device connected in parallel with the MTJ. Photocurrent is generated in the first transistor during a dose rate event, which could damage the MTJ. The device is operable to protect the MTJ during the dose rate event. Additionally, the device may be operable to protect a plurality of MTJs connected in parallel.

The device may be a second transistor. Ideally, the collection volume of the first transistor is substantially the same as a collection volume of the second transistor. The first transistor has a first transistor type and the second transistor has a second transistor type. In one example, the first transistor type is different than the second transistor type. For example, the first transistor may be an n-channel transistor and the second transistor may be a p-channel transistor. In another example, the first transistor type is same as the second transistor type. For example, the first and second transistors may be n-channel transistors. The transistor may shunt photocurrent away from the MTJ, which may protect the MTJ during a dose rate event.

Alternatively, the device may be a diode. The diode may be connected in a either a forward direction or a reverse direction. Alternatively, the device may include a first diode connected in a forward direction and a second diode connected in a reverse direction. The diodes may limit the voltage that can exist across the MTJ, which may protect the MTJ during a dose rate event.

A method of protecting an MRAM bit during a dose rate event includes connecting a first transistor in parallel with a MTJ that is connected in series with a second transistor. Ideally, a collection volume of the first transistor is substantially the same as a collection volume of the second transistor. In one example, the first transistor is a p-channel transistor and the second transistor is an n-channel transistor. In another example, the first transistor and the second transistor are n-channel transistors.

Another method of protecting an MRAM bit during a dose rate event includes connecting at least one diode in parallel with the MTJ in the MRAM bit. The diode may be connected in a forward or reverse direction. Alternatively, the at least one diode includes a first diode connected in a forward direction and a second diode connected in a reverse direction.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

MRAM bits, especially those made with magnetic tunneling junctions, are susceptible to damage during a dose rate event. During a dose rate event, a large photocurrent may be generated by a control transistor connected in series with the tunneling junction. The photocurrent may flow through the tunneling junction, damaging the oxide in the tunneling junction. By shunting the photocurrent away from the tunneling junction and/or limiting the voltage across the tunneling junction, the tunneling junction may be protected during a dose rate event.

Figure 1:
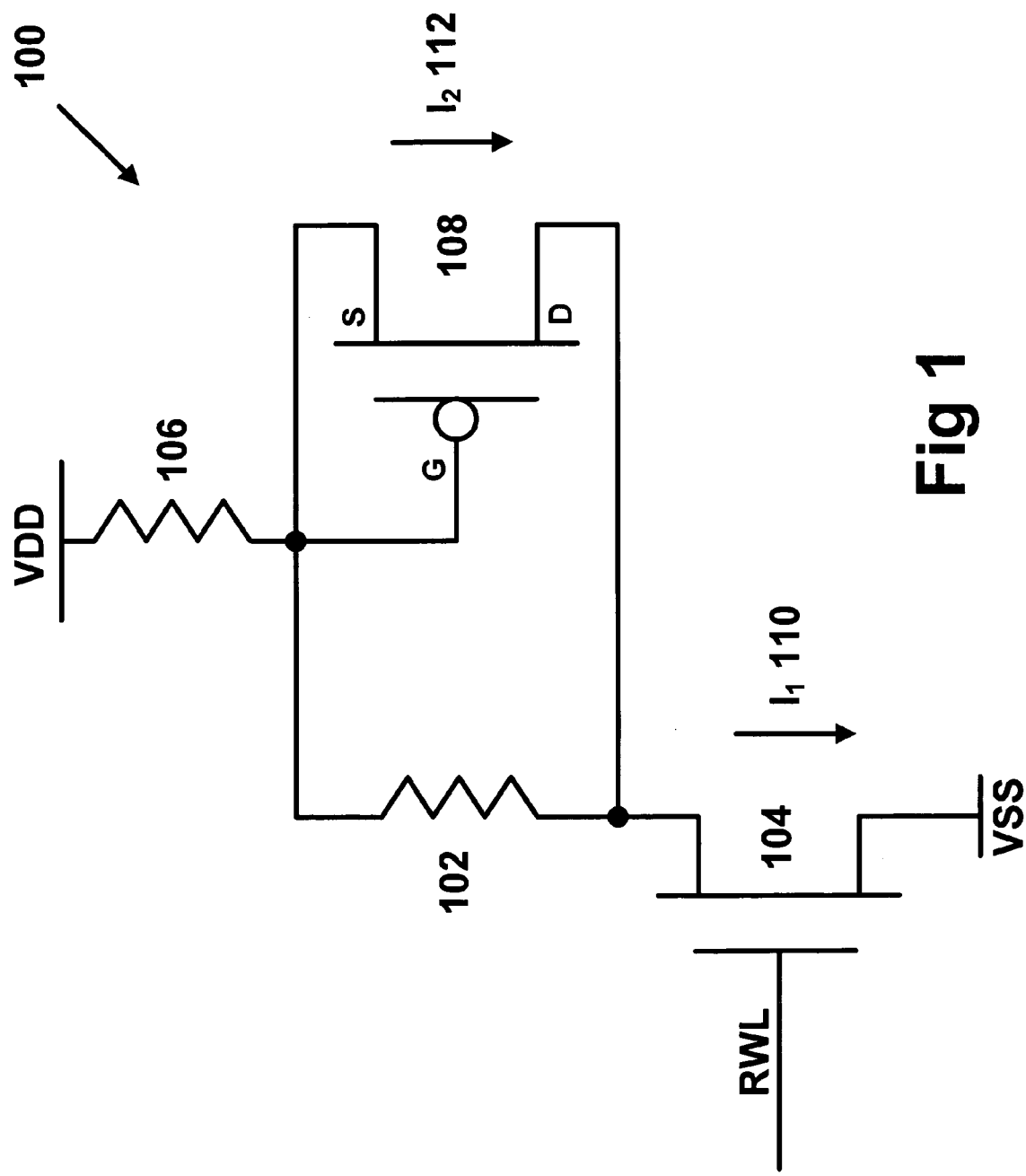
FIG. 1 is a circuit diagram of a hardened MRAM bit, according to an example.

FIG. 1 is a circuit diagram of a hardened MRAM bit 100. The hardened MRAM bit 100 includes an MTJ 102 and a transistor 104 connected in series. The MTJ 102 is depicted in FIG. 1 as a resistor to represent the resistance of an MTJ. The transistor 104 is a selection or control transistor. Typically, the transistor 104 is a read-write low control switch for the MTJ 102. As depicted in FIG. 1, the transistor 104 is an NMOS transistor; however, other transistor types may be used.

Figure 3:
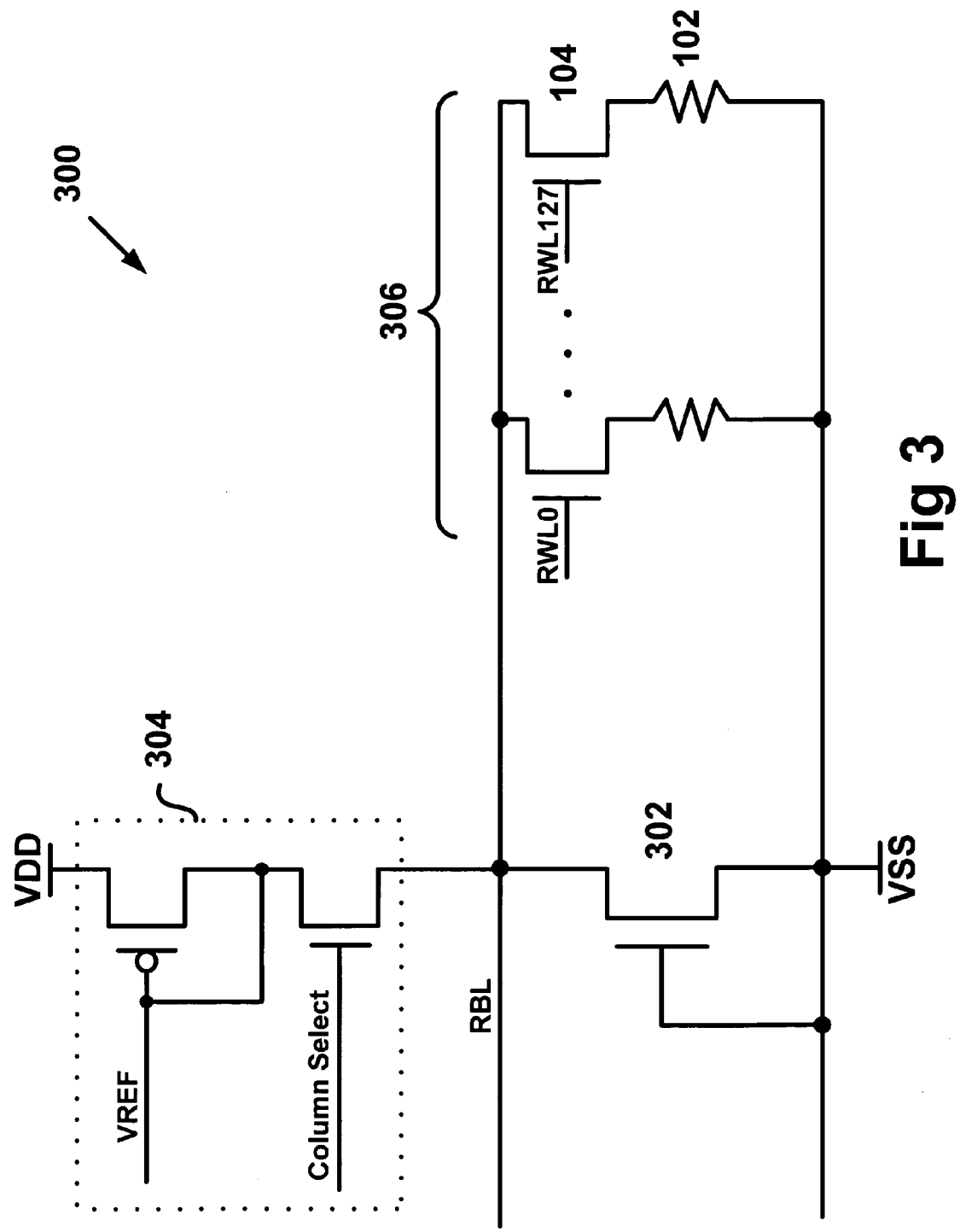
FIG. 3 is a circuit diagram of a hardened row and/or column of MRAM bits, according to an example.

The MTJ 102 is connected in series between the transistor 104 and a resistor 106. The resistor 106 represents parasitic resistance in a Vdd network (i.e., circuitry connected between the MTJ 102 and Vdd). For example, the Vdd network may include additional control circuitry for the MTJ 102, such as a column select transistor. An example Vdd network is depicted in FIG. 3.

A transistor 108 is connected in parallel with the MTJ 102. As shown in FIG. 1, the transistor 108 is a p-channel transistor; however, other transistor types may be used. By selecting the size of the transistor 108, the transistor 108 may reduce, and possibly eliminate, photocurrent from flowing through the MTJ 102 even at a high dose rate. Preferably, the transistor 108 has substantially the same collection volume as the transistor 104. A gate and a source of the transistor 108 are connected. The transistor 108 acts as a compensating transistor during a dose rate event as described below. However, in the absence of a dose rate event, no current is generated from the transistor 108 due to the gate and source connection.

During a dose rate event, a photocurrent ($I_1$) 110 may generate in the transistor 104. Without the transistor 108 connected in parallel with the MTJ 102, the photocurrent flows from Vdd through the MTJ 102 and the transistor 104 to Vss. However, with the transistor 108 connected in parallel with the MTJ 102, a compensating photocurrent ($I_2$) 112 flows from Vdd through the transistor 108 to Vss. As a result, the MTJ 102 is substantially bypassed, protecting the MTJ 102 from dose rate induced damage.

Figure 2:
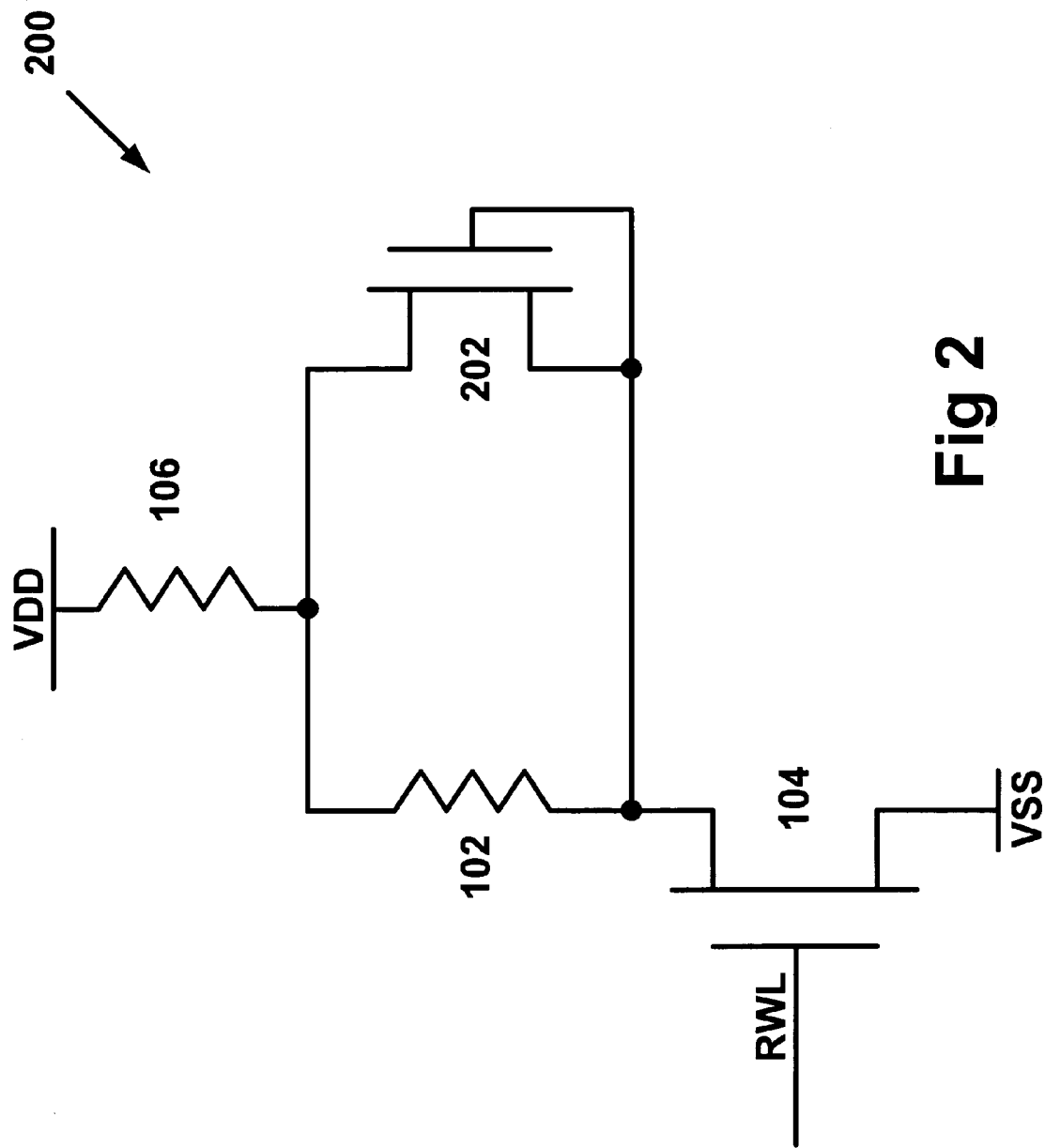
FIG. 2 is a circuit diagram of a hardened MRAM bit, according to another example.

FIG. 2 is a circuit diagram of a hardened MRAM bit 200. The hardened MRAM bit 200 is similar to the hardened MRAM bit 100. In this example, the compensating transistor is an n-channel transistor 202. Preferably, the transistor 202 has substantially the same collection volume as the transistor 104. During a dose rate event, the transistor 202 effectively becomes a short circuit, shunting photocurrent away from the MTJ 102. As a result, excessive bias voltage is prevented from appearing across the MTJ 102.

FIG. 3 is a circuit diagram of a hardened row and/or column of MRAM bits 300. While either a p-channel transistor or an n-channel transistor can be connected in parallel with each MTJ in an array of MRAM bits as described with respect to FIGS. 1 and 2, a single transistor 302 may be used to protect a row and/or column of MRAM bits as shown in FIG. 3.

In FIGS. 1 and 2, the Vdd network was depicted with a resistor 106 that represented the parasitic resistance in a Vdd network. FIG. 3 provides one example of a typical Vdd network 304. The Vdd network 304 includes a current source and a column select. However, other circuitry arrangements may be used in the Vdd network 304. The Vdd network 304 is connected in series with a compensating transistor 302.

The transistor 302 is connected in series with a row and/or column of MRAM bits 306. The MRAM bits 306 include a MTJ and a control transistor similar to the MTJ 102 and transistor 104 depicted in FIGS. 1 and 2. The transistor 302 may have a larger collection volume than the compensating transistors 108, 202 depicted in FIGS. 1 and 2. Preferably, the collection volume of the transistor 302 is approximately the same as the combined collection volume of the control transistors 104 in the MRAM bits 306.

While FIGS. 1—3 have described protecting MRAM bits during a dose rate event using a transistor, other devices may be used to harden MRAM bits. For example, clamping devices, such as diodes, may also be used to protect MRAM bits.

Figure 4:
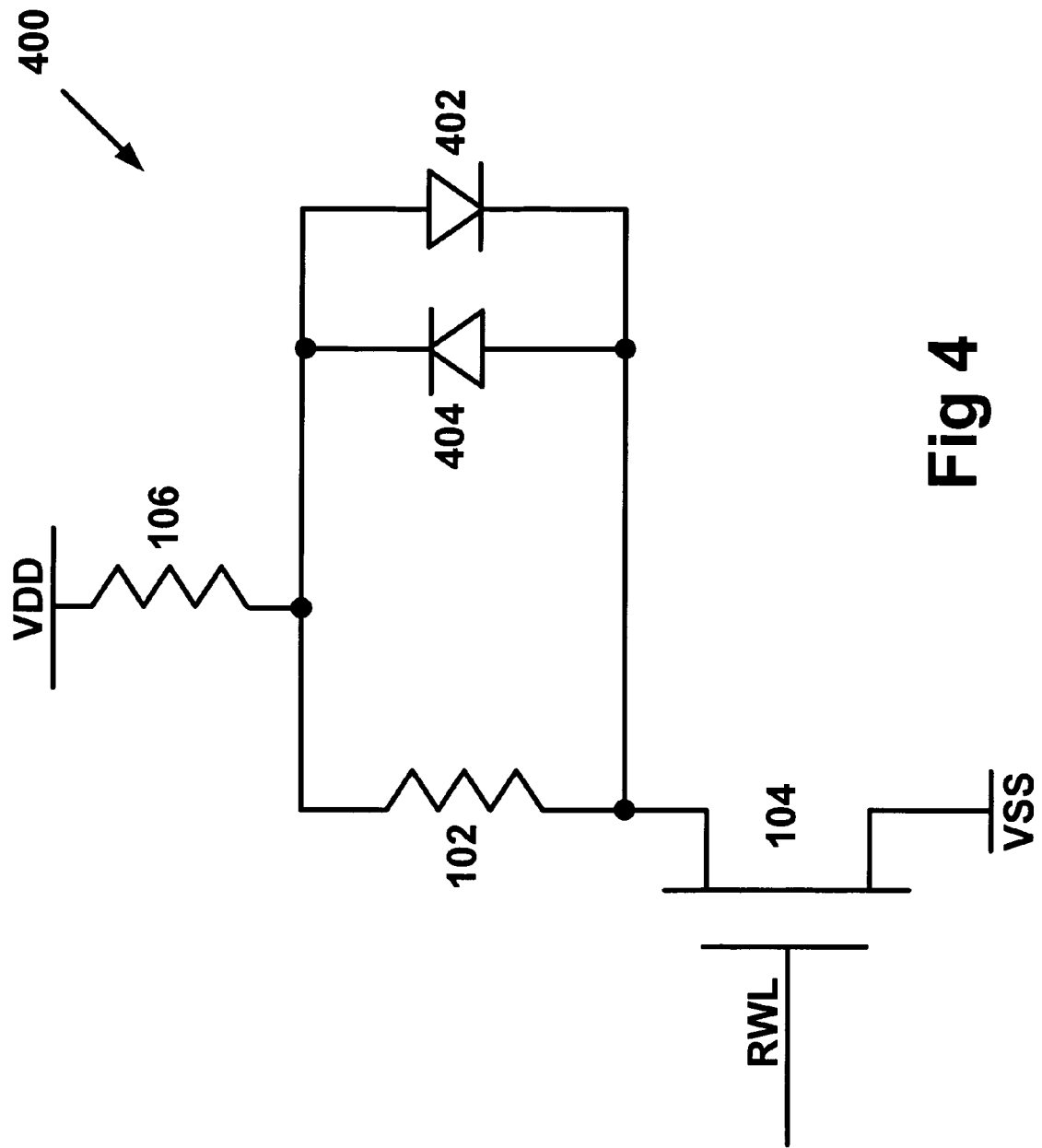
FIG. 4 is a circuit diagram of a hardened MRAM bit, according to another example.

FIG. 4 is a circuit diagram of a hardened MRAM bit 400. In this example, the compensating transistor 108, 202 is replaced with a first diode 402 and/or a second diode 404. The first and second diodes 402, 404 may limit the voltage that can exist across the MTJ 102. The first diode 402 may limit voltage in a forward direction (i.e., from Vdd towards Vss), while the second diode 404 may limit voltage in a reverse direction (i.e., from Vss towards Vdd). Due to potential voltage swings, two diodes, one limiting voltage in the forward direction and one limiting voltage in the reverse direction, are preferably used to protect the MTJ 102. However, one diode may be used, either in the forward or reverse direction, to protect the MTJ 102. By limiting the voltage across the MTJ 102, the MTJ 102 may be protected from excessive voltage.

By shunting the photocurrent away from the tunneling junction and/or limiting the voltage across the tunneling junction, the tunneling junction may be protected during a dose rate event. By protecting the tunneling junction, the MRAM bit may be radiation hardened, i.e., have a tolerance or immunity to radiation effects. As a result, the hardened MRAM bits may be used in military, aerospace, and other applications exposing circuitry to radiation.

It should be understood that the illustrated embodiments are examples only and should not be taken as limiting the scope of the present invention. For instance, the examples described herein to protect an MRAM bit may be used to protect other resistive devices during a dose rate event. Additionally, these examples may also be used to protect MRAM bits and other resistive devices during power fluctuations, other transient events, and/or other device failure events that could cause an MTJ to be subjected to excess voltage. The claims should not be read as limited to the described order or elements unless stated to that effect. Therefore, all embodiments that come within the scope and spirit of the following claims and equivalents thereto are claimed as the invention.

We claim:

1. A hardened magnetoresistive random access memory bit, comprising in combination:
    a magnetic tunnel junction connected in series to a first transistor, wherein a photocurrent is generated in the first transistor during a dose rate event; and
    a device connected in parallel with the magnetic tunnel junction that is operable to protect the magnetic tunnel junction during the dose rate event.

2. The hardened magnetoresistive random access memory bit of claim 1, wherein the device is a second transistor.

3. The hardened magnetoresistive random access memory bit of claim 2, wherein a collection volume of the first transistor is substantially equal to a collection volume of the second transistor.

4. The hardened magnetoresistive random access memory bit of claim 2, wherein the first transistor has a first transistor type and the second transistor has a second transistor type.

5. The hardened magnetoresistive random access memory bit of claim 4, wherein the first transistor type is different than the second transistor type.

6. The hardened magnetoresistive random access memory bit of claim 5, wherein the first transistor is an n-channel transistor and the second transistor is a p-channel transistor.

7. The hardened magnetoresistive random access memory bit of claim 4, wherein the first transistor type is identical to the second transistor type.

8. The hardened magnetoresistive random access memory bit of claim 7, wherein the first transistor and the second transistor are n-channel transistors.

9. The hardened magnetoresistive random access memory bit of claim 1, wherein the device is a diode.

10. The hardened magnetoresistive random access memory bit of claim 9, wherein the diode is connected in a forward direction from Vdd to Vss.

11. The hardened magnetoresistive random access memory bit of claim 9, wherein the diode is connected in a reverse direction from Vdd to Vss.

12. The hardened magnetoresistive random access memory bit of claim 1, wherein the device includes a first diode connected in a forward direction from Vdd to Vss and a second diode connected in a reverse direction from Vdd to Vss.

13. The hardened magnetoresistive random access memory bit of claim 1, wherein the device is operable to protect a plurality of magnetic tunnel junctions connected in parallel.

* * * * *